US006555483B2

(12) United States Patent
Hasegawa (10) Patent No.: US 6,555,483 B2
(45) Date of Patent: Apr. 29, 2003

(54) GATE INSULATION FILM HAVING A SLANTED NITROGEN CONCENTRATION PROFILE

(75) Inventor: Eiji Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/993,833

(22) Filed: Nov. 6, 2001

(65) Prior Publication Data

US 2002/0076869 A1 Jun. 20, 2002

(30) Foreign Application Priority Data

Nov. 9, 2000 (JP) ........................................ 2000-341690

(51) Int. Cl.[7] ............................................ H01L 21/469
(52) U.S. Cl. ........................................ 438/765; 438/786
(58) Field of Search ................................ 438/530, 513, 438/540, 591, 769, 775, 786, FOR 334, FOR 395, FOR 401, 765, FOR 193, FOR 385, FOR 402

(56) References Cited

U.S. PATENT DOCUMENTS 6,087,236 A  *  7/2000  Chau et al. ................. 438/301
2002/0003258 A1  *  1/2002  Keating et al. ............. 257/336

FOREIGN PATENT DOCUMENTS

JP          06-140392          5/1994

* cited by examiner

Primary Examiner—Olik Chaudhuri
Assistant Examiner—Thanh V Pham
(74) Attorney, Agent, or Firm—Scully, Scott, Murphy & Presser (57) ABSTRACT

A gate insulation film includes nitrogen, oxygen and silicon as constituent elements thereof. The nitrogen concentration profile of the gate insulation film in the thickness direction has a maximum concentration in the vicinity of the top surface of the gate insulation film and substantially zero concentration in the vicinity of the silicon substrate. The specified nitrogen profile is obtained by a steep rising slope and a relatively steep falling slope of the temperature profile with time in the step of nitriding a silicon oxide film to form a silicon oxynitride film.

4 Claims, 10 Drawing Sheets

GATE INSULATION FILM HAVING A SLANTED NITROGEN CONCENTRATION PROFILE

BACKGROUND OF THE INVENTION (a) Field of the Invention

The present invention relates to a gate insulation film having a slanted nitrogen concentration profile and, more particularly, to a MOSFET having a gate insulation film which prevents degradation of the on-current characteristic of the MOSFET.

(b) Description of the Related Art

LSIs (large-scale integrated circuits) are categorized into two types including a memory device and a logic device. Both types of LSIs are generally implemented by MOSFET circuits by taking advantages of higher integration capability and low costs thereof.

As is well known, the operational principle of the MOSFET is such that a control voltage applied to the gate electrode, which is disposed on the semiconductor substrate with an intervention of a gate insulation film therebetween, controls the conductivity of the channel region induced on the surface area of the semiconductor substrate just under the gate insulation film. In this respect, the gate insulation film is the key element of the semiconductor device comprised of the MOSFET circuits, and it is one of the most important issues to form the gate insulation film with higher reliability and superior controllability.

In the recent logic devices, under the circumstances as described above, a silicon oxide ($SiO_2$) film widely used as the gate insulation film has a thickness as low as about 3.0 nanometers (nm), and this thickness becomes further smaller responding to the requirement of higher performances of the logic devices.

The smaller thickness of the gate insulation film involves the problems of increase in the gate leakage current and penetration of impurities through the gate insulation film from the gate electrode. The former results from the degradation of the insulation capability of the gate insulation film due to the smaller thickness. On the other hand, the latter occurs when impurity ions such as boron or phosphorous ions doped in the gate electrode made of polysilicon, for example, readily penetrate the thin gate insulation film during the heat treatment in the fabrication process.

In particular, the latter causes a change or variance in the conductivity of the channel due to the impurity ions reached to the channel by the penetration, whereby the characteristics of the MOSFET such as the drain current and the threshold voltage thereof significantly vary to affect the operation of the MOSFET.

In order to suppress the increase in the gate leakage current, it is effective to use another insulation film having a higher dielectric constant as the gate insulation film instead of the silicon oxide film, as known in the prior art. In order to suppress the impurity penetration, it is effective to dope the silicon oxide film with nitrogen to form a silicon oxynitride (SiON) film. It is known that the silicon oxynitride film has a higher dielectric constant compared to the silicon oxide film. Thus, the silicon oxynitride film has been used in the prior art for suppression of the increase in the gate leakage current and the impurity penetration through the gate insulation film.

Patent Publication JP-A-6(1994)-140392, for example, describes a fabrication process for a semiconductor device, wherein a silicon oxynitride film formed by nitriding a silicon oxide film is used as the gate insulation film. In the described process, nitrogen radicals generated by optical excitation alone or in combination with plasma excitation are used for nitriding the silicon oxide film. In the nitriding step, the optical excitation process provides an energy assistance for the nitriding, whereby even a relatively lower temperature between 700 and 900 degrees C effects the nitriding.

There is a problem in the process as described above that the nitrogen radicals are generated by using the optical excitation, which is generally difficult to control. In addition, an optimum temperature profile with time for the process of introducing the nitrogen radicals into the silicon oxide film is not described therein and is difficult to find. Thus, it is desired to form a silicon oxynitride film with a suitable reproducibility and in-plane uniformity in the fabrication of MOSFETs in a semiconductor device.

Figure 1:
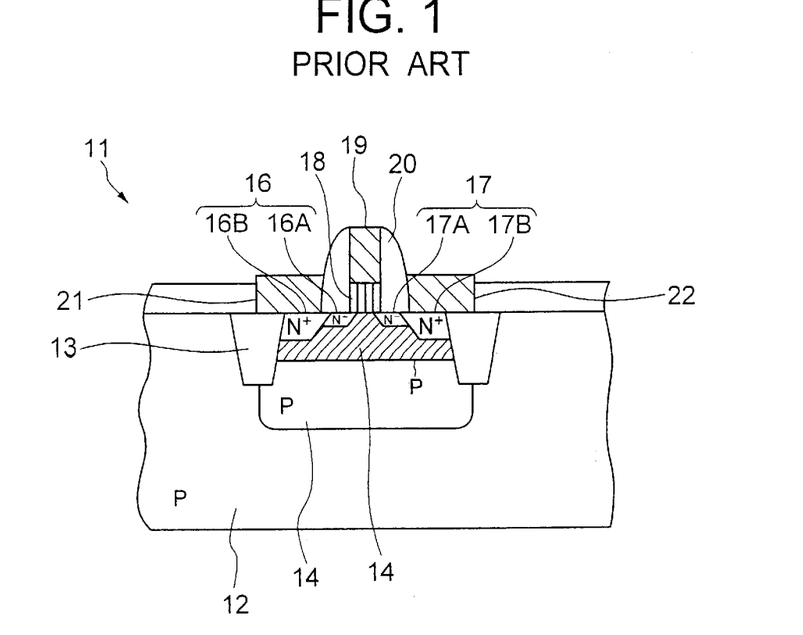
FIG. 1 is a sectional view of a MOSFET in a typical semiconductor device.
Figure 2:
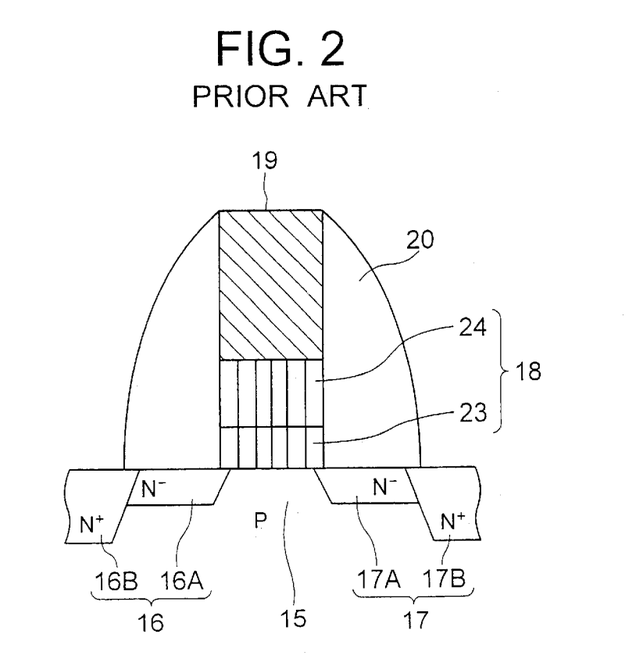
FIG. 2 is a partial enlarged view of the MOSFET of FIG. 1.

FIG. 1 is a sectional view of a typical semiconductor device which may be fabricated by the process described in the above publication, and FIG. 2 is an enlarged partial view thereof.

The semiconductor device includes a p-type silicon substrate 12, an isolation region 13 formed by a STI technique on the silicon substrate 12, a p-well formed in the active region isolated by the isolation region 13, a threshold-controlling well 15 formed in the surface area of the p-well 14, an n-type source region 16 including a lightly doped region 16A and a heavily doped region 16B selectively formed in the threshold-controlling well 15, an n-type drain region 17 including a lightly doped region 17A and a heavily doped region 17B selectively formed in the threshold-controlling well 15, a gate electrode 19 formed on the silicon substrate 12 with an intervention of a gate insulation film 18 therebetween, side-wall insulation films 20 covering the side walls of the gate insulation film 18 and the gate electrode 19, a pair of source/drain electrodes 21 and 22 formed on the n-type source/drain regions 16 and 17, respectively.

In FIGS. 1 and 2, an nMOSFET is exemplified, wherein the n-type source/drain regions 16 and 17 have a so-called LDD (lightly doped drain) structure.

The gate insulation film 18 has a two-layer structure including a silicon oxide film 23 and an overlying silicon oxynitride film 24, as shown in FIG. 2. The overall thickness of the gate insulation film 18 is around 1.75 nm. In fact, the thickness of the silicon oxide film 23 is around 1.6 nm before the silicon oxynitride film 24 is formed by nitriding the silicon oxide film.

Figure 3A:
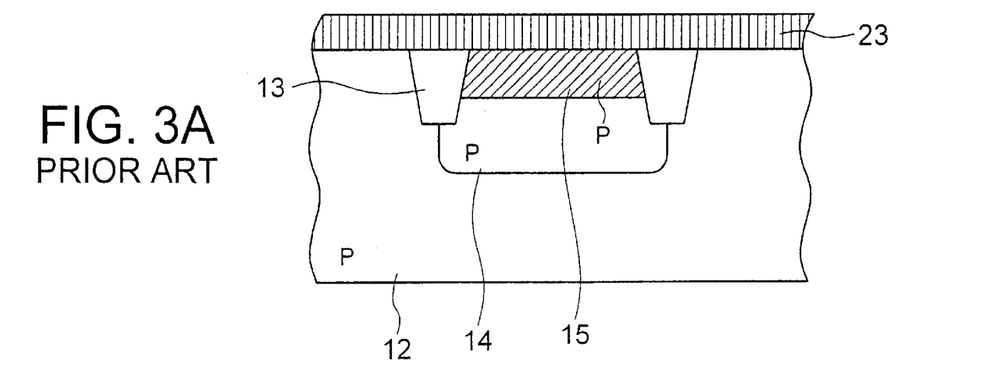
FIGS. 3A to 3E are sectional views of a MOSFET in consecutive steps of a conventional fabrication process.

FIGS. 3A to 3E show consecutive fabrication steps of a conventional fabrication process for the nMOSFET of FIG. 1. An isolation region 13, a p-well 14 and a threshold-controlling well 15 are first formed on a p-type silicon substrate 12, followed by heat treating the same in a chamber of a single-wafer-processing type, for example. Thus, a silicon oxide film 23 having a thickness of about 1.6 nm is formed on the substrate 12, as shown in FIG. 3A.

Figure 3B:
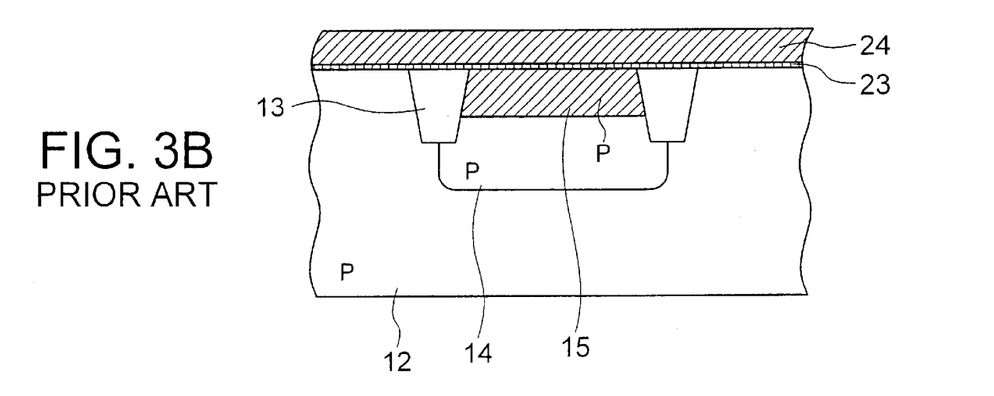
Figure 4:
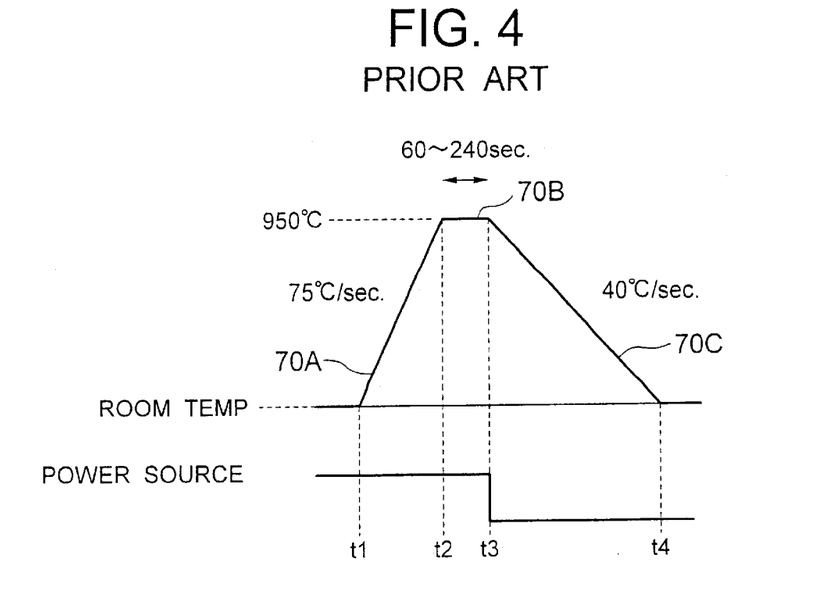
FIG. 4 is a graph showing a temperature profile with time in the nitriding step in the conventional fabrication process.

Subsequently, nitrogen is introduced into the silicon oxide film 23 to form a silicon oxynitride film 24 on top of the silicon oxide film 23, as shown in FIG. 3B. In this step, the silicon wafer is received in a plasma chamber, after plasma is generated by applying a power source to nitrogen gas to change the same into plasma source including nitrogen atoms and nitrogen radicals. The silicon wafer is heated based on the typical temperature profile having a rising slope 70A having a rising rate of 75 degrees C. per second, a flat peak 70B at 950 degrees C., and a falling slope 70C having a rising rate of 40 degrees C. per second, as shown in FIG. 4.

The power source is turned OFF at the last of the flat peak 70B of the temperature profile. By using the plasma source together with the heat treatment, nitrogen is introduced to the surface area of the silicon oxide film 23 to from a silicon oxynitride film 24 on the silicon oxide film 23. This process is called a rapid thermal process (RTP). The original thickness of the gate insulation film 18 at 1.6 nm is changed to 1.75 nm after the RTP.

Figure 3C:
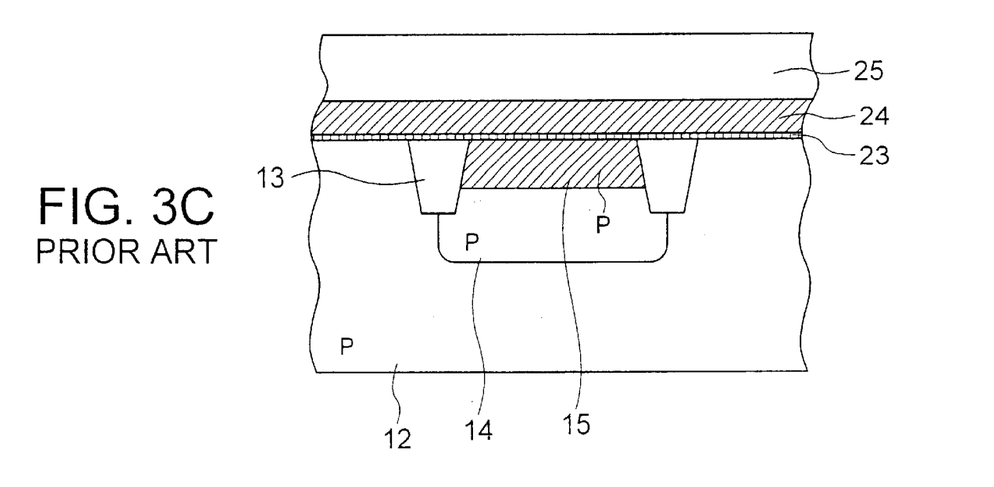
Figure 3D:
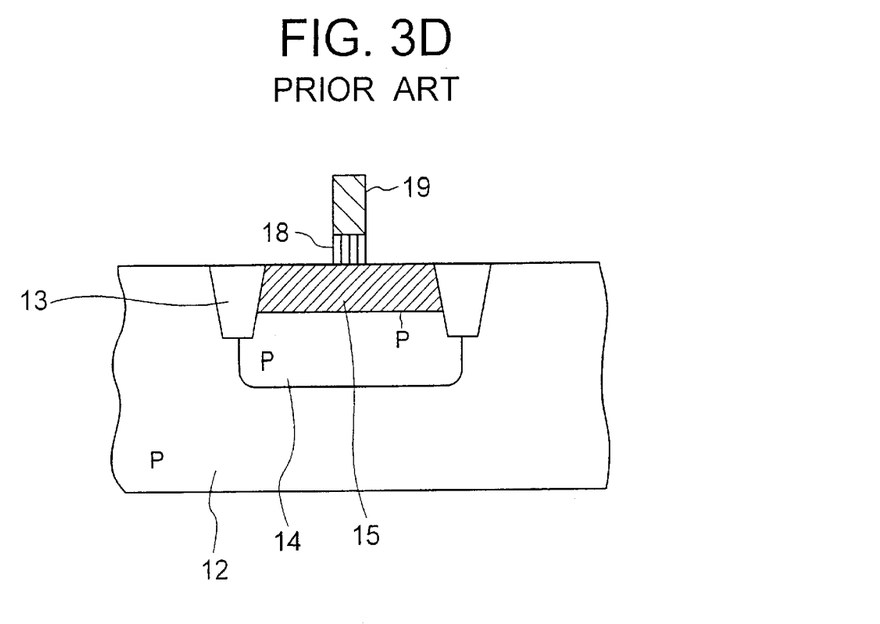

Subsequently, a polysilicon (polycrystalline silicon) film 25 is deposited using a CVD technique on the entire surface of the wafer, as shown in FIG. 3C, followed by patterning the polysilicon film 25 and the silicon oxide film 23 together with the silicon oxynitride film 24 by using a known photolithographic technique, to thereby form a gate insulation film 18 and a gate electrode 19, as shown in FIG. 3D.

Figure 3E:
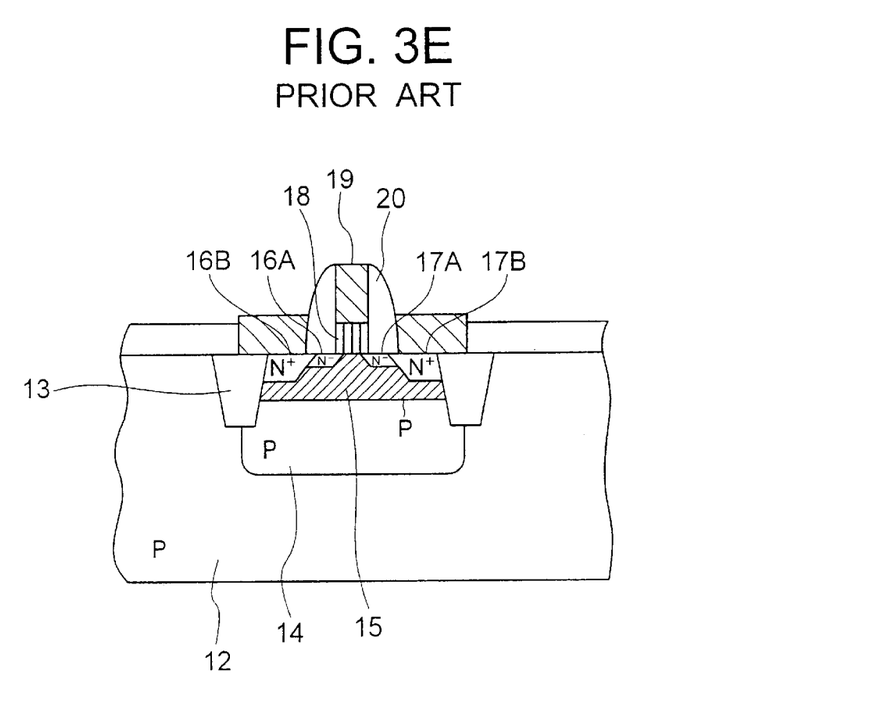

Thereafter, n-type impurities are introduced by an ion-implantation technique using the gate electrode 19 as a mask to form a lightly doped regions 16A and 17A, followed by forming side-wall insulation films 20 for covering the side walls of the gate electrode 19 and the gate insulation film 18. N-type impurities are then introduced by ion-implantation using the sidewall insulation films 20 and the gate electrode 19 as a mask to form heavily doped regions 16B and 17B, whereby n-type source/drain regions 16 and 17 are formed, as shown in FIG. 3E. Source/drain electrodes 21 and 22 are then formed on the source/drain regions 16 and 17 to complete the nMOSFET of FIG. 1.

Figure 5:
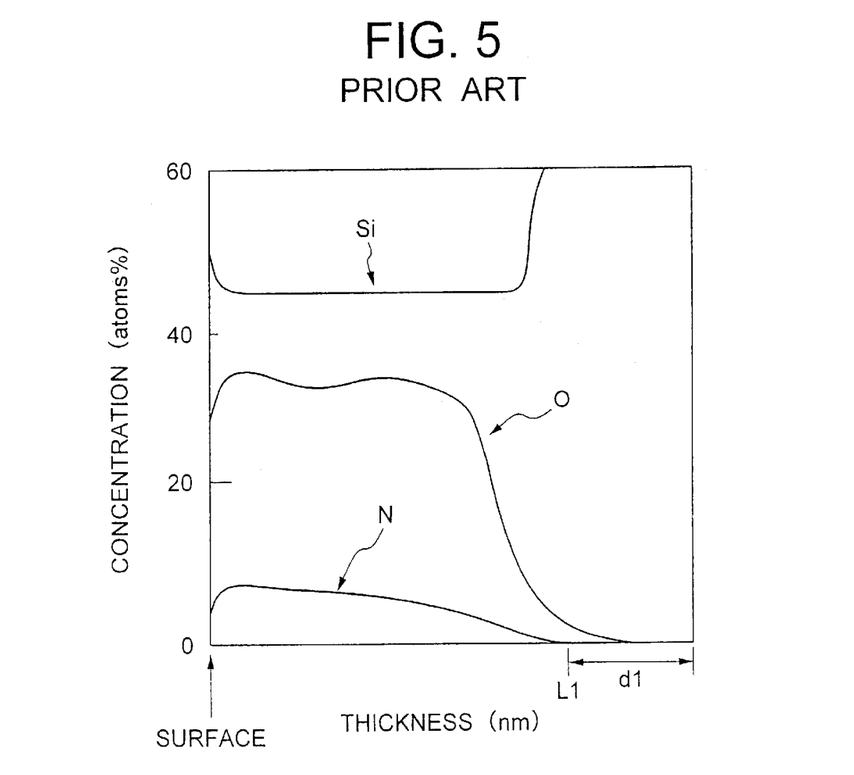
FIG. 5 is a graph showing concentration profiles of elements in the gate insulation film of the conventional MOSFET.

FIG. 5 shows concentration profiles of the gate insulation film 18 obtained by secondary ion mass spectroscopy (SIMS). In FIG. 5, atomic percent concentrations of nitrogen, oxygen and silicon in the gate insulation film 18 are plotted on ordinate against the depth in the gate insulation film 18 plotted on abscissa. The SIMS is conducted for evaluation of the film property of the gate insulation film 18, to obtain the concentration profile of any of the elements along the thickness direction of the gate insulation film 18.

As understood from FIG. 5, the nitrogen concentration profile has a maximum at 7 to 8 atomic percents in the vicinity of the top surface of the gate insulation film 18, reduces monotonically from the top surface toward the bottom or silicon substrate 12, and assumes zero in the range between the bottom and the location L1 which is d1 nm (as small as 0.46 nm) apart from the bottom. The area wherein the nitrogen concentration assumes zero is occupied solely by oxygen and silicon atoms of $SiO_2$ film 23.

There is a problem found by the present inventor for the conventional semiconductor device in that the MOSFET has a poor on-current characteristic due to the specific nitrogen concentration profile thereof. More specifically, since the depth d1 is as small as 0.46 nm, the nitrogen content in the vicinity of the surface of the silicon substrate 12 causes that the carriers flowing through the channel region just under the gate insulation film 18 are scattered by the influence of the fixed positive charge, which is generated in the gate insulation film 18 due to the presence of the nitrogen content. This degrades the on-current characteristic of the MOSFET. If the nitrogen content appears in more vicinity of the substrate surface or reaches to the substrate surface, the on-current characteristic is further degraded due to the occurrence of the interface state.

SUMMARY OF THE INVENTION

In view of the above, it is an object of the present invention to provide a semiconductor device having a gate insulation film which prevents degradation of the on-current characteristic of MOSFETs.

It is another object of the present invention to provide a method for fabricating such a semiconductor device by controlling the nitrogen concentration profile of the gate insulation film.

The present invention provides a semiconductor device comprising a semiconductor substrate, and a MOSFET formed thereon and including a gate electrode, a gate insulation film and source/drain regions, said gate insulation film including nitrogen, oxygen and silicon atoms as constituent elements thereof, wherein a nitrogen concentration profile of said gate insulation film with respect to a thickness direction thereof has a maximum nitrogen concentration between 10 and 30 percents.

The present invention also provides a method for fabricating a MOSFET comprising the steps of: forming a gate insulation film made of silicon oxide on a semiconductor substrate; introducing nitrogen into said gate insulation film in a plasma ambient including nitrogen to form a silicon oxynitride film, said nitrogen introducing step including a thermal treatment, said thermal treatment using a temperature profile with time including a rising slope rising at a rate between 200 and 400 degrees C. per seconds, a peak temperature between 450 and 1200 degrees C., and a falling slope falling at a rate between 50 and 200 degrees C. per seconds; and forming a gate electrode and source/drain regions in association with said gate insulation film.

In accordance with the MOSFET in the semiconductor device of the present invention, degradation of the on-current characteristic of the MOSFET can be suppressed.

In accordance with the MOSFET manufactured by the method of the present invention, nitrogen can be introduced to the silicon oxide film with a superior controllability, whereby the MOSFET of the present invention can be formed with a higher yield.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings.

A MOSFET in a semiconductor device according to an embodiment of the present invention has a structure shown in FIGS. 1 and 2, More specifically, the semiconductor device of the present embodiment includes a p-type silicon substrate 12, an isolation region 13 formed by a STI technique on the silicon substrate 12, a p-well formed in the active region isolated by the isolation region 13, a threshold-controlling well 15 formed in the surface area of the p-well 14, an n-type source region 16 including a lightly doped region 16A and a heavily doped region 16B selectively formed in the threshold-controlling well 15, an n-type drain region 17 including a lightly doped region 17A and a heavily doped region 17B selectively formed in the threshold-controlling well 15, a gate electrode 19 formed on the silicon substrate 12 with an intervention of a gate insulation film 18 therebetween, side-wall insulation films 20 covering the side walls of the gate insulation film 18 and the gate electrode 19, a pair of source/drain electrodes 21 and 22 formed on the n-type source/drain regions 16 and 17, respectively.

In FIGS. 1 and 2, an nMOSFET is exemplified, wherein the n-type source/drain regions 16 and 17 have a so-called LDD (lightly doped drain) structure.

The gate insulation film 18 has a two-layer structure including a silicon oxide film 23 and an overlying silicon oxynitride film 24, as shown in FIG. 2. The overall thickness of the gate insulation film 18 is around 1.75 nm. The thickness of the silicon oxide film 23 is around 1.6 nm before the silicon oxynitride film 24 is formed on top of the silicon oxide film 23.

Figure 6:
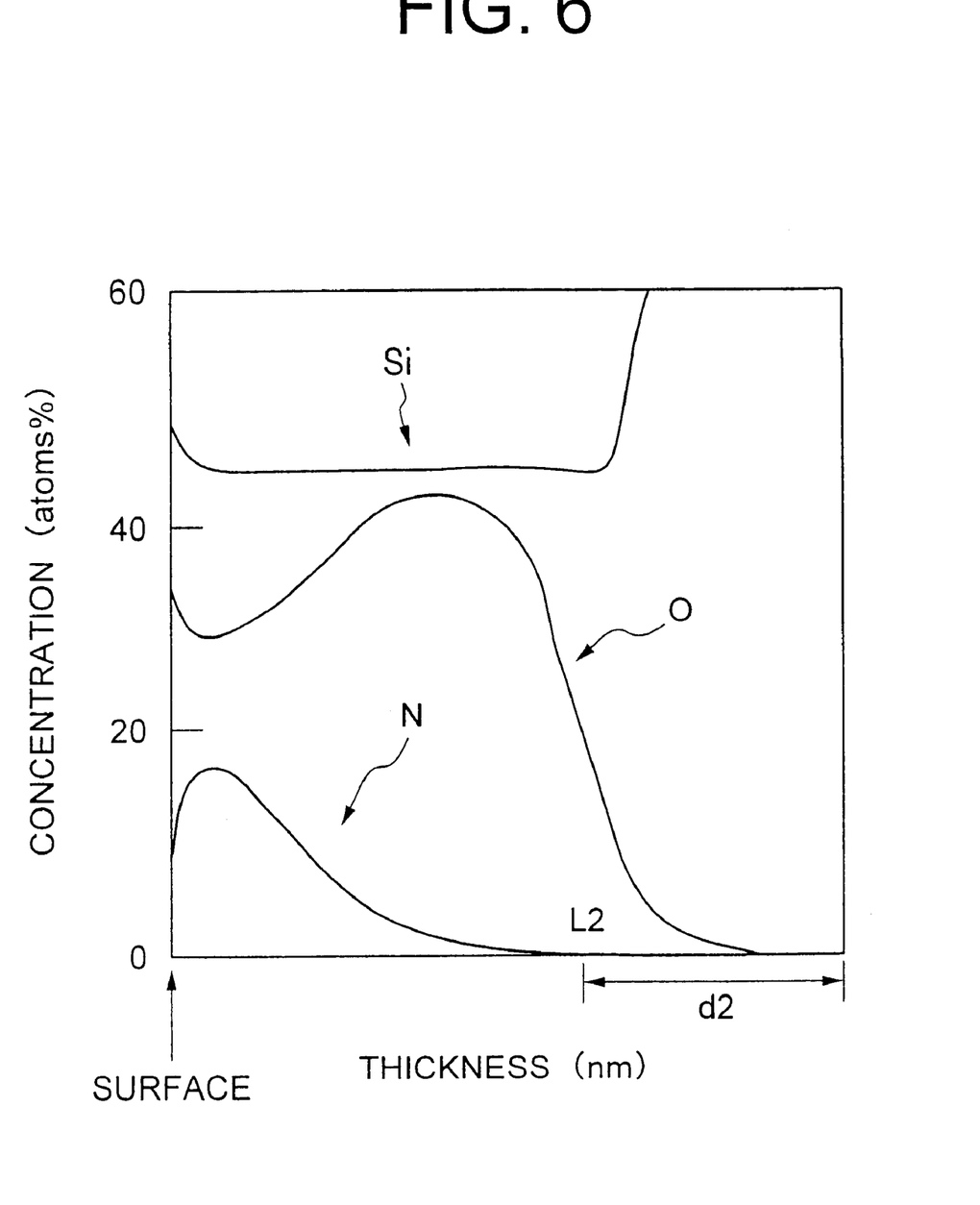
FIG. 6 is a graph showing concentration profiles of elements in a gate insulation film in a MOSFET according to an embodiment of the present invention.

The gate insulation film 18 has concentration profiles of silicon, oxygen and nitrogen atoms shown in FIG. 6. More specifically, the nitrogen concentration profile has a maximum at 16 to 18 atomic percents in the vicinity of the top surface thereof, which is greater than the maximum (7 to 8 atomic percents) of the conventional device. The nitrogen concentration in the present embodiment reduces abruptly from the maximum nitrogen concentration toward the substrate surface, and assumes zero at the location (L2) which is d2 nm (0.7 nm) apart from the substrate surface, d2 being far greater than d1 in the conventional device. Thus, the gate insulation film 18 includes only oxygen and silicon in the area between the location (L2) and the substrate surface or in the silicon oxide film 23.

Figures 7A, 7B:
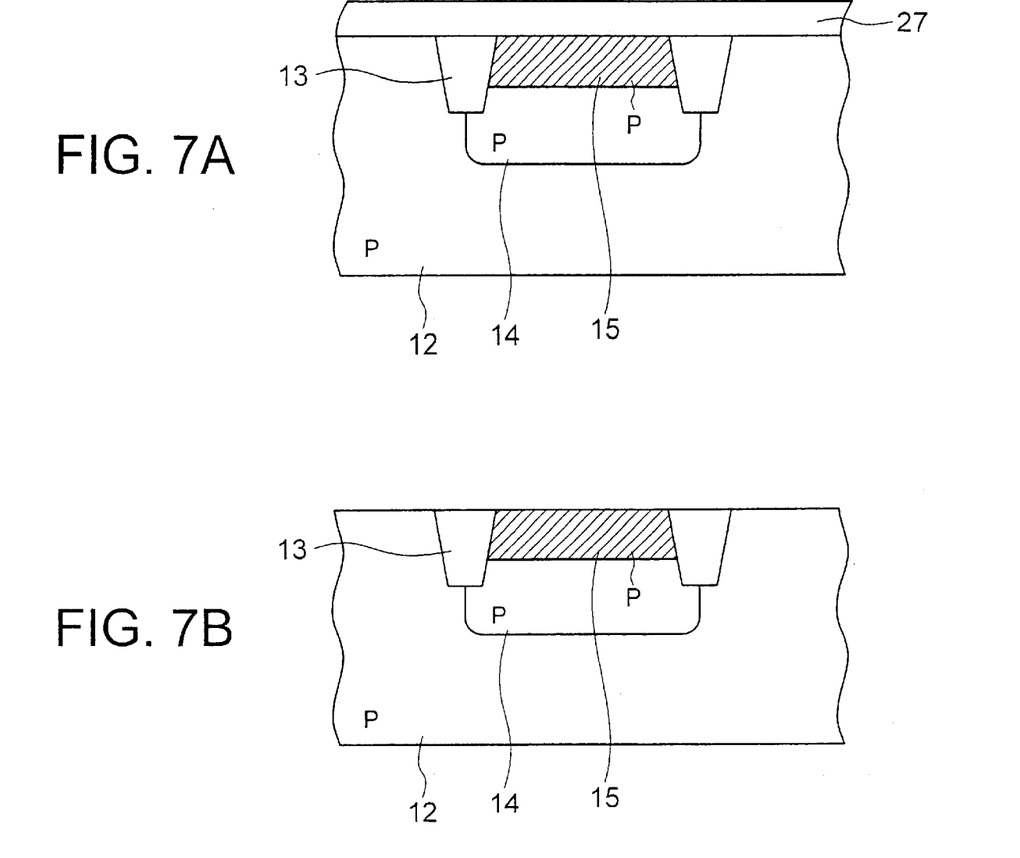
FIGS. 7A to 7I are sectional views consecutively showing the MOSFET of the embodiment in consecutive steps of the fabrication process thereof.

FIGS. 7A to 7I show consecutive fabrication steps of a process for forming the nMOSFET of FIG. 1 according to an embodiment (first embodiment) of the present invention. An isolation region 13 is first formed on a p-type silicon substrate 12 by a known STI technique, followed by forming a sacrificial oxide layer 27 having a thickness of about 20 nm on the entire substrate surface by using a heat treatment. Thereafter, p-type impurity ions such as boron ions are introduced by ion-implantation through the sacrificial oxide layer 27 to form a p-well 14, followed by further ion-implantation of p-type impurities to form a threshold controlling well 15 within the p-well 14, as shown in FIG. 7A.

Figure 7C:
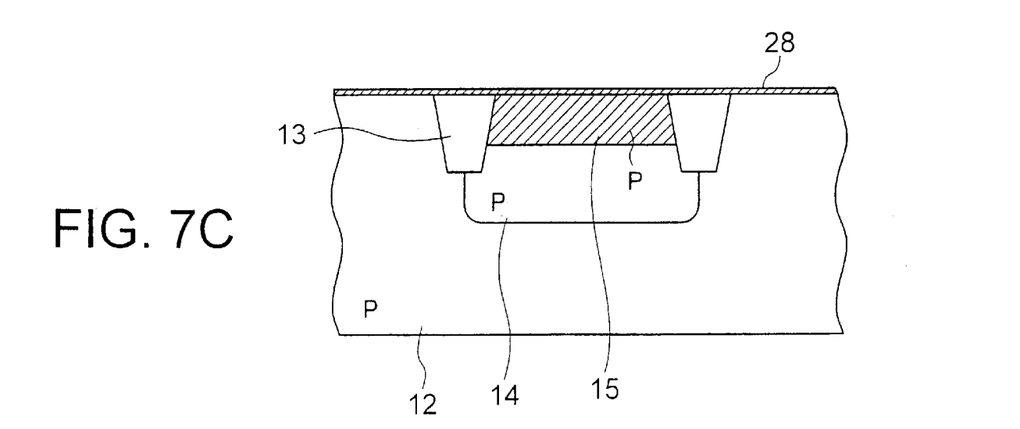

Subsequently, the sacrificial oxide layer 27 is removed by wet etching using a hydrochloric acid solution to expose the surface of the silicon substrate 12, as shown in FIG. 7B. The wafer is then soaked for cleaning the exposed substrate surface in a mixture of chemicals such as including ammonium, hydrogen peroxide and pure water, or sulfuric acid, hydrogen peroxide and pure water, thereby chemically forming a chemical silicon oxide film 28 having a thickness around 1.0 nm on the exposed substrate surface, as shown in FIG. 7C.

Figure 7D:
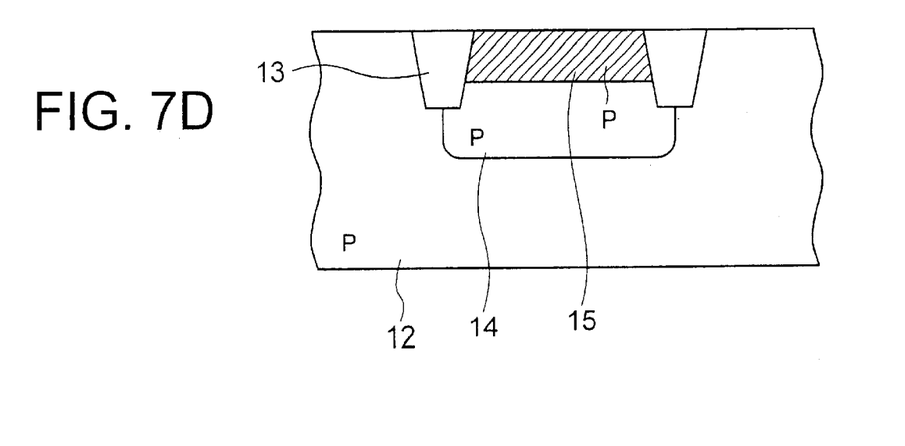

The chemical oxide film 28 is then removed by soaking and washing the wafer surface in a dilute hydrochloric acid solution, a shown in FIG. 7D. Alternatively, this step may be omitted to leave the chemical oxide film 28.

Figure 7E:
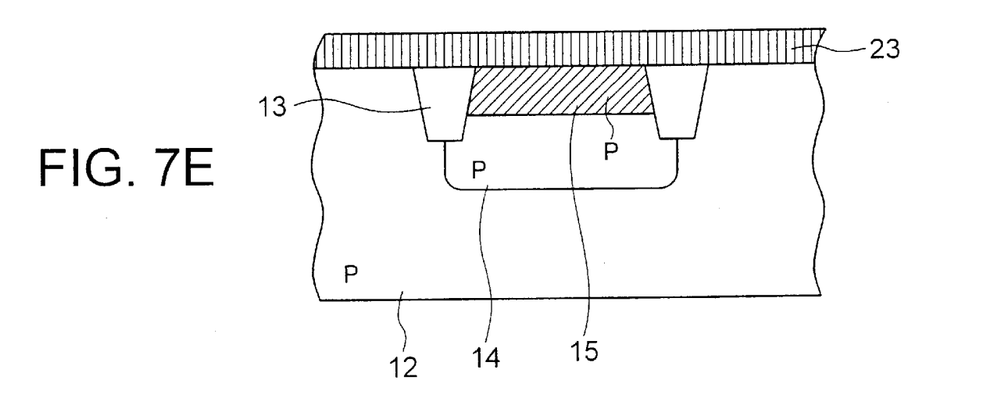

Subsequently, the silicon wafer is received in a chamber of single-wafer-processing type, wherein the silicon wafer is thermally treated in an oxidizing ambient to form a silicon oxide film 23 having a thickness around 1.6 nm on the surface of the silicon substrate 12, as shown in FIG. 7E. In this thermal treatment, the silicon wafer is treated at about 850 degrees C. for about 35 seconds in an oxidizing ambient such as including $O_2$ and $N_2$ at a ratio of $O_2/N_2=10\%$, while the chamber is maintained at a vacuum pressure of about 6650 Pascal (Pa). Alternatively, the wafer is thermally treated at about 800 degrees C. for 15 seconds, after $O_2$ gas and $N_2$ gas are introduced in the chamber and maintained at a vacuum pressure of 6650 Pa.

If the chemical oxide film 28 is not removed in the step of FIG. 7D, the chemical oxide film 28 may be used instead of the thermal silicon oxide film 23 after the thermal treatment, because the chemical oxide film 28 is refined to have superior film properties by the thermal treatment.

Figure 7F:
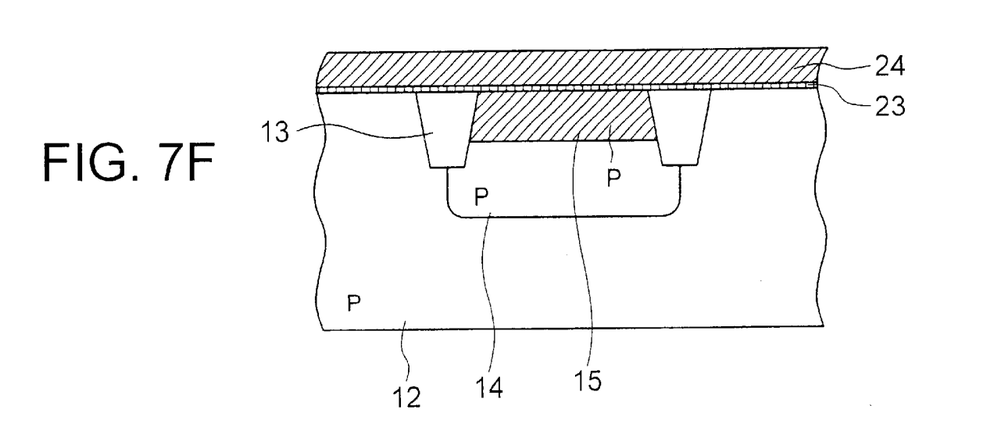

Subsequently, nitrogen is introduced to the silicon oxide film 23 on the silicon substrate 12, thereby forming a silicon oxynitride film 24 on the silicon oxide film 23, as shown in FIG. 7F. In this step, the silicon wafer is received in a plasma chamber, after nitrogen plasma is generated by applying a power source to nitrogen gas to change the same into plasma source including nitrogen atoms and nitrogen radicals.

Figure 8:
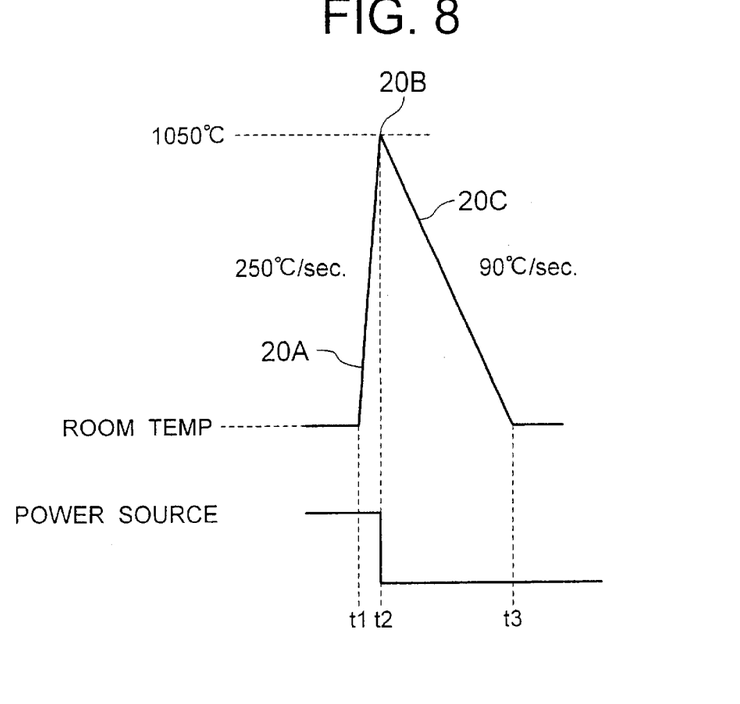
FIG. 8 is a graph showing a temperature profile used in a fabrication process according to an embodiment of the present invention during nitriding the silicon oxide film in the MOSFET of the embodiment.

Then, the silicon wafer is heated based on the temperature profile of FIG. 8, the temperature profile having a steep rising slope 20A rising from the room temperature at time instant t1 at a rate of 250 degrees C. per second, a peak temperature 20B at about 1050 degrees C. at time instant t2, and a relatively steep falling slope 20C falling to the room temperature at time instant t3 at a rate of 90 degrees per second. The power source for the plasma is turned OFF when the substrate temperature reaches about 1050 degrees C. at time instant t2. The thermal treatment based on such a temperature profile allows nitrogen to be introduced from the plasma source to the silicon oxide film with a superior controllability and reproducibility to form a silicon oxynitride film 24. Thus, a gate insulation film 18 having the silicon oxynitride film 24 and the underlying silicon oxide film 23 can be obtained. The overall thickness of the gate insulation film 18 is increased from 1.6 nm to 1.75 nm during the nitriding.

The temperature profile with time, as shown in FIG. 8, including the steep rising slope 20A, the relatively higher peak temperature 20B at about 1050 degrees C., and the relatively steep falling slope 20C allows a superior controllability in the introduction of nitrogen.

More specifically, the nitrogen introduced in the gate insulation film stays at a relatively shallower location of the gate insulation film 18 without diffusion to the deeper location, due to the short time interval of the thermal treatment, whereby the nitrogen concentration is lower in the vicinity of the substrate surface compared to the MOSFET fabricated by the conventional process having the temperature profile shown in FIG. 4. This allows the maximum nitrogen concentration appearing in the vicinity of the top surface of the gate insulation film 18 to be higher compared to the maximum concentration in the conventional MOSFET. Accordingly, the functions of the nitrogen introduced in the gate insulation film 18 for suppressing the increase of the gate leakage current and for suppressing the boron penetration can be improved.

Figure 7G:
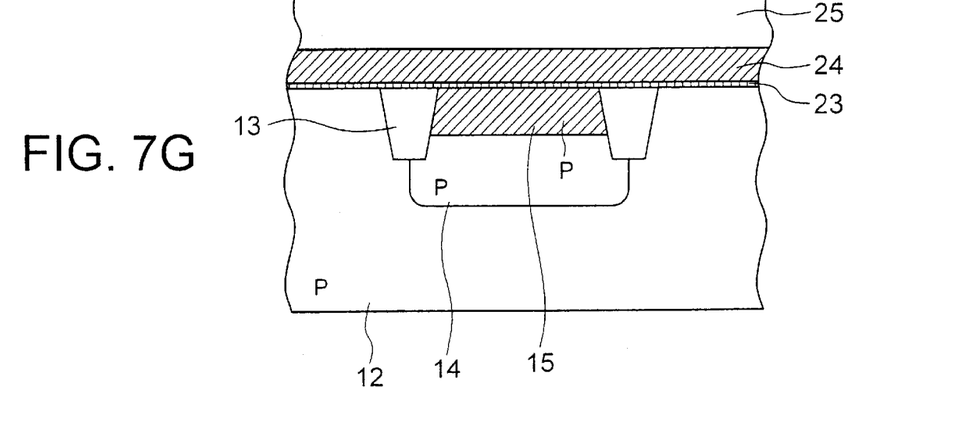
Figure 7H:
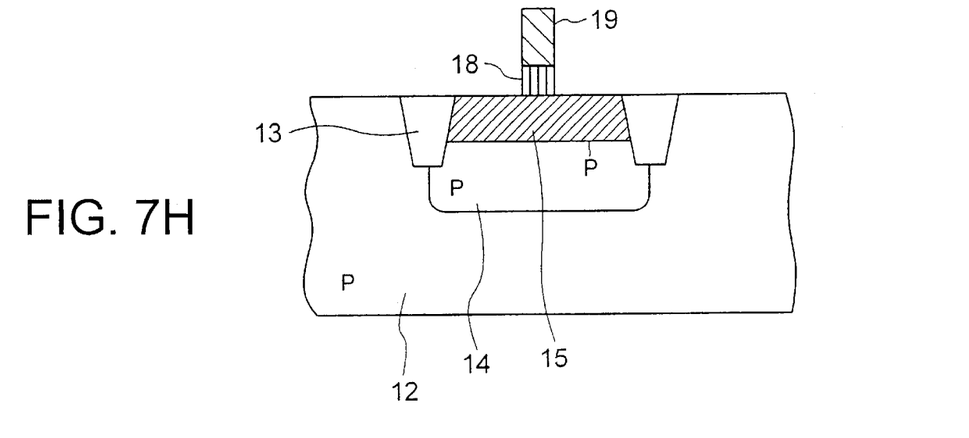

Subsequently, a polysilicon film 25 is deposited using a CVD technique on the entire surface of the wafer, as shown in FIG. 7G, followed by patterning the polysilicon film 25 and the silicon oxide film 23 together with the silicon oxynitride film 24 by using a known photolithographic technique. Thus, a gate insulation film 18 and a gate electrode 19 are formed, as shown in FIG. 7H.

Figure 7I:
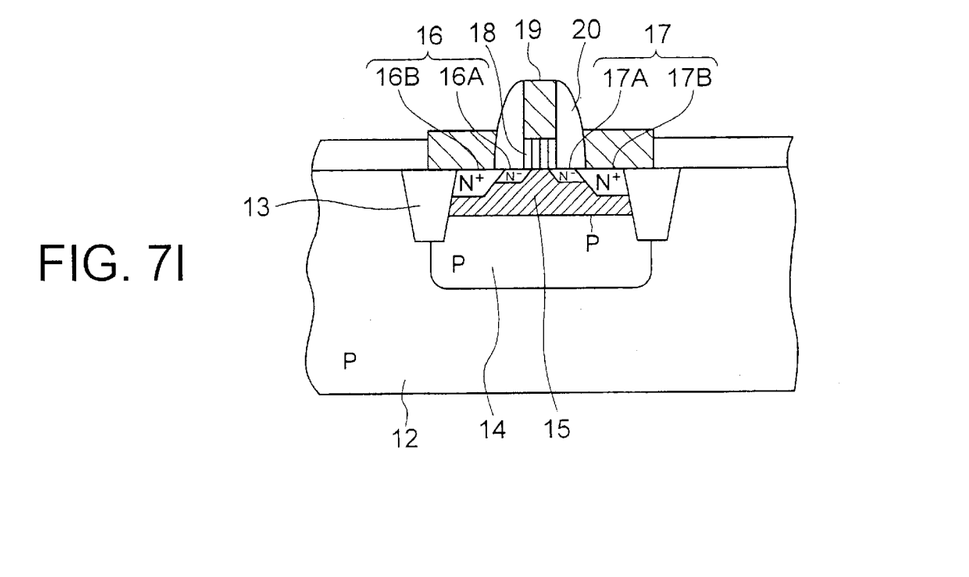

Thereafter, n-type impurities such as phosphorous are introduced using an ion-implantation technique using the gate electrode 19 as a mask to form a lightly doped regions 16A and 17A, followed by forming side-wall insulation films 20 for covering the side walls of the gate electrode 19 and the gate insulation film 18. N-type impurities are further introduced by ion-implantation using the side-wall insulation films 20 and the gate electrode 19 as a mask to form heavily doped regions 16B and 17B, whereby n-type source/drain regions 16 and 17 are formed, as shown in FIG. 7I. Source/drain electrodes 21 and 22 are then formed on the source/drain regions 16 and 17 to complete the nMOSFET of the present embodiment, such as shown in FIG. 1.

As understood by comparing FIG. 6 against FIG. 5, the maximum nitrogen concentration (16 to 17%) in the vicinity of the top surface of the gate insulation film 18 in the present embodiment is approximately twice or more of the maximum concentration (7 to 8%) in the conventional device. The concentration profile of FIG. 6 reduces abruptly toward the substrate surface, and the distance d2 between the location L2 and the substrate surface is larger than the distance d1 between the location L1 and the substrate surface in the conventional device.

Figure 9:
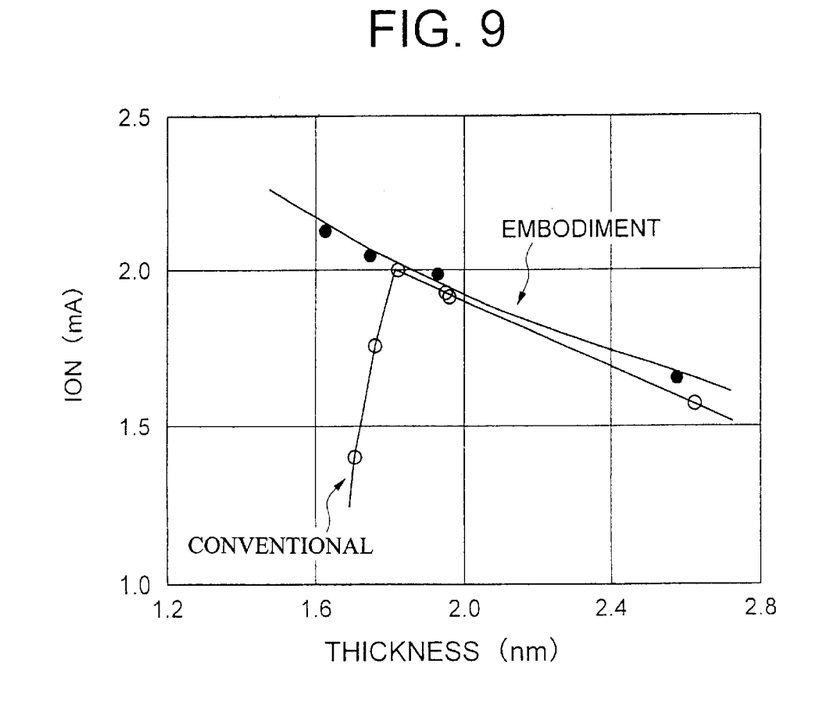
FIG. 9 is a graph showing the on-current characteristic of the MOSFET in the embodiment compared to that in the conventional device.

FIG. 9 shows the on-current characteristics of the MOSFET of the embodiment and the conventional MOSFET, wherein the on-current Ion is plotted on ordinate against the location in the thickness direction of the gate insulation film, which is converted into the effective oxide thickness and plotted on the abscissa. Each MOSFET has a gate length of 0.3 $\mu$m, and a gate width of 10 $\mu$m.

As observed from FIG. 9, in the MOSFET of the embodiment, the on-current Ion of the MOSFET monotonically and moderately increases with the reduction of the thickness of the gate insulation film. On the other hand, in the conventional MOSFET, the on-current Ion abruptly decreases with the thickness of the gate insulation film below 1.8 nm. This means a significant improvement of the on-current characteristic of the MOSFET by the present invention.

The reason for the improvement of the on-current characteristic is considered due to the temperature profile of FIG. 8 which allows a superior controllability in introduction of nitrogen into the surface region of the gate insulation film. The higher maximum nitrogen concentration in the vicinity of the top surface of the gate insulation film 18 allows the nitrogen concentration profile to have a larger distance (d2) of substantially zero-nitrogen area adjacent to the substrate surface 19.

In the conventional MOSFET, the lower rising rate or falling rate of the temperature as well as the flat peak temperature allows nitrogen to advance toward the substrate surface due to thermal diffusion thereof. This degrades the on-current characteristic of the MOSFET. A lower peak temperature, if used, may prevent the nitrogen from being thermally diffused toward the substrate surface. However, the overall nitrogen concentration will be lower in this case, which limits the functions of nitrogen for suppressing the increase of the gate off-leak current and preventing the impurity penetration from the gate electrode. Thus, nitrogen is not effectively introduced into the oxide film.

The larger zero-nitrogen area of the gate insulation film in the vicinity of the substrate surface prevents the fixed positive charge generated in the gate insulation film from affecting the carriers in the channel. More specifically, the carriers flowing through the channel in the surface area of the silicon substrate just under the gate insulation film are not scattered by the fixed positive charge. As a result, the degradation of the on-current characteristic can be suppressed, and accordingly, formation of the interface state is also suppressed which further prevents the degradation of the on-current characteristic.

In the experiments conducted by the inventor, it was confirmed that the degradation of the on-current characteristic could be effectively suppressed by setting the distance d2 of the zero-nitrogen area at 0.7 nm or above between the substrate surface and the location L2 at which the nitrogen concentration first assumes zero. For example, the distance d2 of the zero-nitrogen area in the present embodiment is set at 0.7 nm or above for all the range of the thickness plotted on abscissa in FIG. 9. This allows the gate insulation film to have a smaller thickness, such as a 1.6-nm thickness. The temperature profile shown in FIG. 8 also raises the throughput of the fabrication process due to the steep rising rate and the relatively steep falling rate.

Figure 10:
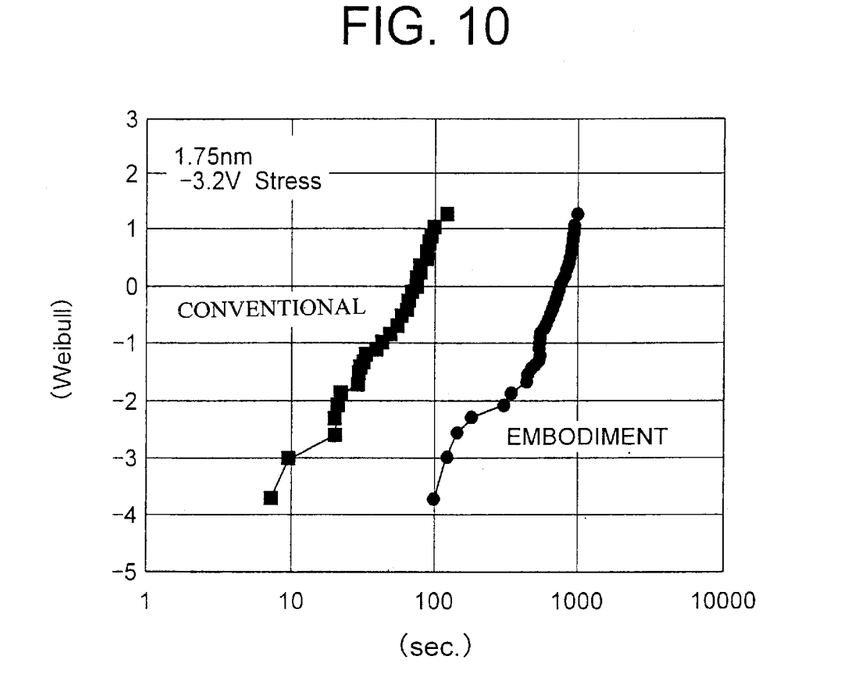
FIG. 10 is a graph showing the TDDB (time dependent dielectric breakdown) characteristic of the MOSFET in the embodiment compared to that in the conventional device.

FIG. 10 shows the TDDB characteristics of the MOSFETs of the embodiment and the conventional MOSFETs, wherein the cumulative failure (Weibull) of samples of gate insulation films which went to breakdown is plotted on ordinate against each specified time instant (second) at which the number of samples of gate insulation films went to breakdown was counted. In the experiments, a voltage of −3.2 volts was applied to the samples each having a thickness of 1.75 nm. As observed from FIG. 10, almost all of the conventional MOSFETs failed after 10 to 100 seconds of voltage application, and the MOSFETs of the present embodiment endured 100 to 1,000 seconds after the voltage application, thereby increasing the time length for the occurrence of breakdown. This means an improvement of reliability of the gate insulation film in the MOSFET by the present invention.

The improvement of the reliability results from the larger maximum nitrogen concentration, which prevents the impurities such as boron ions in the gate electrode from entering to the gate insulation film. In the conventional MOSFETs, the boron ions etc. are readily introduced to the gate insulation film due to the lower maximum nitrogen concentration and a moderate slope of the nitrogen profile in the vicinity of the top surface of the gate insulation film.

Based on the experiments by the inventor, it was confirmed that similar results were also obtained in the case of other temperature profiles each including a rising slope 20A having a rising rate of 200 to 400 degrees C. per seconds, and a falling slope 20C having a falling rate of 50 to 200 degrees C. per second.

In other words, the process according to the present invention may use a temperature profile which includes a rising slope having a rising rate of 200 to 450 degrees C., a peak at 450 to 1200 degrees C., and a falling slope having a falling rate of 50 to 200 degrees C.

Figure 11:
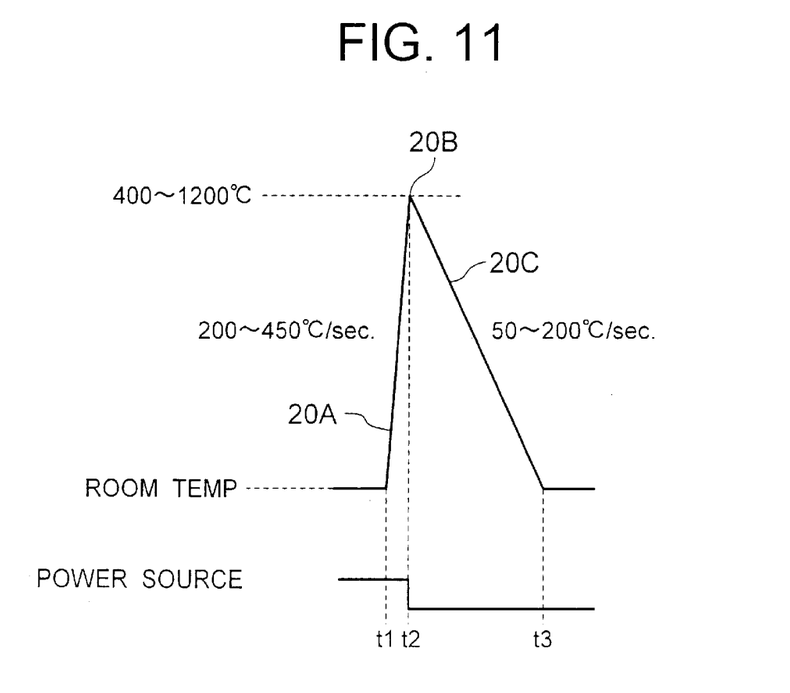
FIG. 11 is a graph showing a temperature profile with time in the nitriding step in a fabrication process according to another embodiment.

Referring to FIG. 11, a temperature profile used in a fabrication process according to another embodiment (second embodiment) has a peak temperature which is controlled between 400 and 1200 degrees C. This configuration allows the rising rate of the rising slope 20A to be controlled between 200 and 450 degrees C. per second and the falling rate of the falling slope 20C to be controlled between 50 and 200 degrees C. per second. These ranges of rates provides 10 to 30% for the maximum nitrogen concentration in the vicinity of the top surface of the gate insulation film, and allow the nitrogen concentration profile with respect to the thickness direction to have a steep slope. Thus, nitrogen is not substantially introduced in the area between the substrate surface and the location L2 which is 0.7 nm apart from the substrate surface.

In a modification of the fabrication processes of the first embodiment, the power source for the plasma is maintained ON during the entire thermal treatment for introduction of nitrogen. This provides a stable ambient temperature, thereby somewhat improving the reproducibility and the in-plane uniformity of the nitrogen profile in the wafer. The rising rate and the falling rate of the temperature may be selected similarly to the temperature profile shown in FIG. 8. In this modification, the falling rate is more important, and preferably selected at 90 degrees or above in this modification.

In a further modification of the first embodiment, the peak temperature of 1050 degrees C. is maintained for 180 seconds or less for the thermal treatment. In this case, both the rising rate and the falling rate are important, and are selected similarly to the temperature profile of FIG. 8.

In the above description, the gate insulation film is formed in the gas ambient including a mixture of $O_2$ and $N_2$ or mixture of $O_2$ and $H_2$. However, a mixture of $O_2$, $N_2$ and $H_2$ may be used as the ambient gas. The nitrogen source for the nitrogen to be introduced into the silicon oxide film is not limited to atomic nitrogen or nitrogen radicals, and may use nitrogen oxide such as $N_2O$, NO, $NO_2$ or ammonium ($NH_3$) alone or in combination with other gas or gases.

The chamber for forming therein the silicon oxide film and introducing nitrogen into the silicon oxide film may be a batch-type chamber instead of the single-wafer-type chamber. The thickness of the conductive film or the insulation film and process for forming the conductive film or the insulation film may be selected depending on the use or object of the semiconductor device. The conductive type may be reversed from the above examples, i.e., the conductive type of the MOSFET may be of p-type or n-type.

Since the above embodiments are described only for examples, the present invention is not limited to the above embodiments and various modifications or alterations can be easily made therefrom by those skilled in the art without departing from the scope of the present invention.

What is claimed is:

1. A method for fabricating a MOSFET comprising the steps of:

forming a gate insulation film made of silicon oxide on a semiconductor substrate;

introducing nitrogen into said gate insulation film in a plasma ambient including nitrogen to form a silicon oxynitride film, said nitrogen introducing step including a thermal treatment, said thermal treatment using a temperature profile with time including a rising slope rising at a rate between 200 and 400 degrees C. per seconds, a peak temperature between 450 and 1200 degrees C., and a falling slope falling at a rate between 50 and 200 degrees C. per seconds; and forming a gate electrode and source/drain regions in association with said gate insulation film.

2. The method as defined in claim 1, wherein said peak temperature is maintained for 180 seconds or less.

3. The method as defined in claim 1, wherein said plasma ambient is generated by a power source which is turned OFF at said peak temperature.

4. The method as defined in claim 1, wherein said nitrogen introducing step uses at least one of $N_2$, $N_2O$, NO and $NH_3$ gases as a nitrogen source.

* * * * *